US008135153B2

(12) United States Patent
Boltyenkov et al.

(10) Patent No.: US 8,135,153 B2
(45) Date of Patent: Mar. 13, 2012

(54) COMPUTERIZED AUTOMATIC WAX GUARD DESIGN MODELING SYSTEM AND METHOD FOR HEARING INSTRUMENTS

(75) Inventors: Artem Boltyenkov, Lawrenceville, NJ (US); Tong Fang, Morganville, NJ (US); Fred McBagonluri, East Windsor, NJ (US); Andreas Reh, Princeton, NJ (US)

(73) Assignees: Siemens Hearing Instruments, Inc., Piscataway, NJ (US); Siemens Corporation, Iselin, NJ (US)

( * ) Notice: Subject to any disclaimer, the term of this patent is extended or adjusted under 35 U.S.C. 154(b) by 1372 days.

(21) Appl. No.: 11/733,262

(22) Filed: Apr. 10, 2007

(65) Prior Publication Data
US 2008/0253597 A1    Oct. 16, 2008

(51) Int. Cl.
*H04R 25/00* (2006.01)
(52) U.S. Cl. ...... 381/325; 381/322; 700/98; 364/474.05
(58) Field of Classification Search .................. 381/322, 381/324, 325, 328, 330; 703/1; 700/163; 29/896.21
See application file for complete search history.

(56) References Cited

U.S. PATENT DOCUMENTS

| | | | |
|---|---|---|---|
| 6,484,842 B1 * | 11/2002 | Widmer et al. | 181/129 |
| 6,595,317 B1 * | 7/2003 | Widmer et al. | 181/135 |
| 6,920,414 B2 * | 7/2005 | Topholm | 703/1 |
| 7,092,543 B1 * | 8/2006 | Mahoney et al. | 381/328 |
| 2002/0196954 A1 | 12/2002 | Marxen et al. | |
| 2003/0074174 A1 * | 4/2003 | Fu et al. | 703/13 |
| 2005/0117765 A1 * | 6/2005 | Meyer et al. | 381/322 |
| 2006/0256990 A1 | 11/2006 | Holmes | |
| 2008/0253597 A1 * | 10/2008 | Boltyenkov et al. | 381/325 |

FOREIGN PATENT DOCUMENTS
EP    1246506 A1    10/2002
WO    WO 0230157 A2    4/2002
* cited by examiner

*Primary Examiner* — Fan Tsang
*Assistant Examiner* — Eugene Zhao
(74) *Attorney, Agent, or Firm* — Francis G Montgomery

(57) ABSTRACT

A method and appertaining system provide for automatically adding a wax guard to a hearing aid shell impression. The location of a canal, tip of the canal, and central line of the impression are automatically identified in a digital 3D representation of a hearing aid shell impression. A first wax guard plane is determined at a predefined flip distance from the canal tip along the central line, and a second wax guard plane is determined at a predefined canal tip offset distance from the canal tip along the central line. A size and position for a feature of the wax guard is calculated based on predefined parameters, and the wax guard is constructed utilizing the calculated side and position. The type of wax guard can be a bell bore design, an open design, a Philip design, or a flip design.

17 Claims, 3 Drawing Sheets

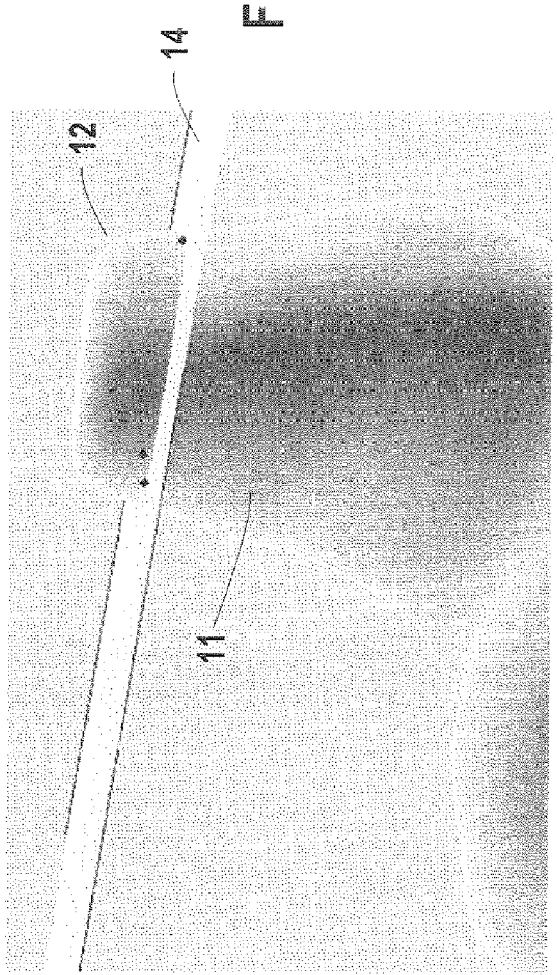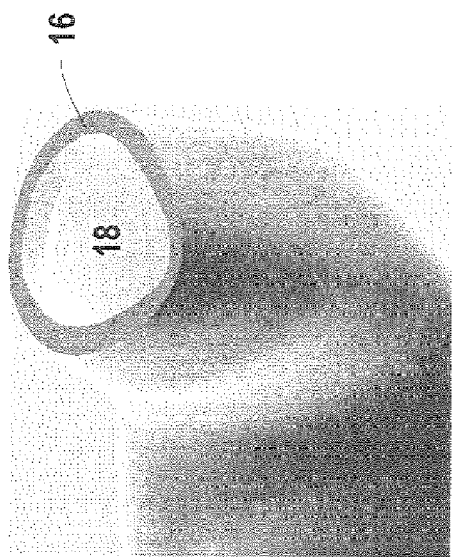

COMPUTERIZED AUTOMATIC WAX GUARD DESIGN MODELING SYSTEM AND METHOD FOR HEARING INSTRUMENTS

BACKGROUND

The present invention provides protocols for automatic positioning and generation of a wax guard protection system for hearing instruments. The system is designed to interface with a feature recognition module, such as that described in U.S. Pat. No. 7,605,812, entitled, "Intelligent Modeling Method and System for Earmold Shell and Hearing Aid Design", issued on Oct. 20, 2009 to McBagonluri et al, herein incorporated by reference.

In general, a wax guard is a structure on the tip of a hearing aid shell used to protect the electronic components inside the shell from the wax entering from the patient's ear. Wax Guard systems are added to a large percentage of in-the-ear (ITE) hearing instrument products produced today, and many of the existing hearing instruments have some sort of wax protection systems associated with them. These systems are usually engineered to fit comfortably on most impressions and are empirically generated mostly by trial and error within 3D modeling media.

Different types of wax guard systems currently exist in the hearing instruments industry, and include flip tops, Philips, open wax, and bell bores; these systems are usually implemented as a sculptural modification to the impression. Other types of wax systems are not sculptured onto the impression but rather are added to the impression as a 3D dimensional object designed externally and added to the hearing instrument. In certain instances both types of wax system are mutually used together. This present invention focuses on the former, where the implementation is adaptive to a given instrument.

SUMMARY

The present invention is directed to a computerized and automatic method for the generation of wax guard systems using an adaptive algorithmic implementation. It includes embodiments for: 1) computerized automated and adaptive generation of a wax guard system for a given ear impression using dimensional features extracted from the impression. This ensures that each individual ear has a wax protection system generated specifically for it; 2) a software implementation of adaptive algorithms which allow different types of wax systems to be generated by simply altering parameters that control the wax guard generation protocols; and 3) a system for the adaptive generation of wax systems that also significantly improves the quality of the finished instrument.

The positioning approach provided herein advantageously takes advantage of feature recognition algorithms and systems generated automatically for a given shell using advanced shell classification protocols, and provides a mechanism to position the wax guards automatically on the shell based on information provided by the feature recognition algorithms and systems.

Specifically, an embodiment of the invention is directed to a method for automatically adding a wax guard to a hearing aid shell impression, comprising: providing a digital 3D representation of a hearing aid shell impression; automatically identifying location information for a canal, tip of the canal, and central line of the impression; determining a first wax guard plane at a predefined flip distance from the canal tip along the central line; determining a second wax guard plane at a predefined canal tip offset distance from the canal tip along the central line; calculating a size and position for a feature of the wax guard based on predefined parameters; and constructing the wax guard utilizing the calculated size and position.

An embodiment of the invention is directed to a computer-based system for automatically adding a wax guard to a hearing aid shell impression, comprising: a processor; a user display device connected to the processor; a data storage device connected to the processor and the user display device, the storage device containing a 3D representation of a hearing aid shell impression; a software module for automatically identifying location information for a canal, tip of the canal, and central line of the impression from the 3D representation of the hearing aid shell impression; a software module for determining a first wax guard plane at a predefined flip distance from the canal tip along the central line; a software module for determining a second wax guard plane at a predefined canal tip offset distance from the canal tip along the central line; a software module for calculating a size and position for a feature of the wax guard based on predefined parameters; and a software module for producing a finished model of the shell including the wax guard utilizing the calculated size and position.

DESCRIPTION OF THE DRAWINGS

The invention is described in detail below with reference to various preferred embodiments as illustrated in the figures and appertaining following description.

FIGS. 2A-C are image files of an open wax guard system; and

DETAILED DESCRIPTION OF THE PREFERRED EMBODIMENTS

Figure 1A:
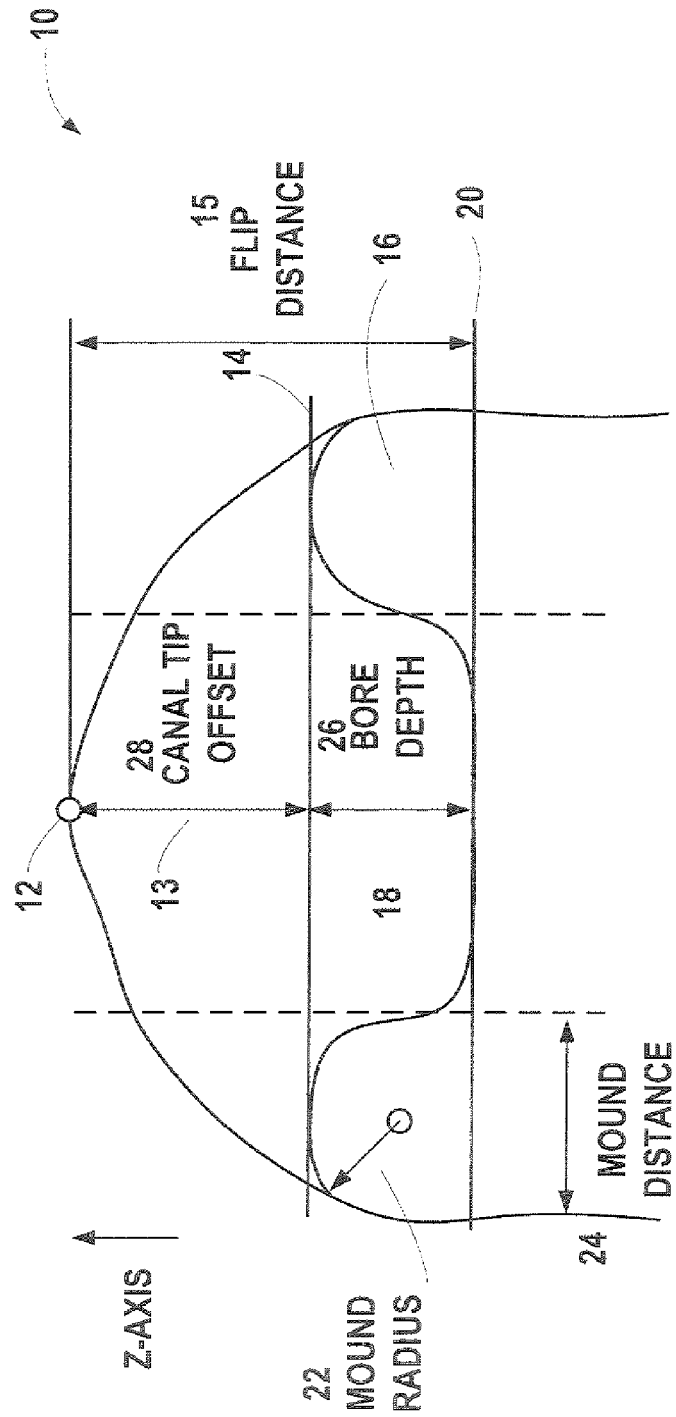
FIG. 1A is a pictorial drawing of a bell bore implementation.
Figure 1B:
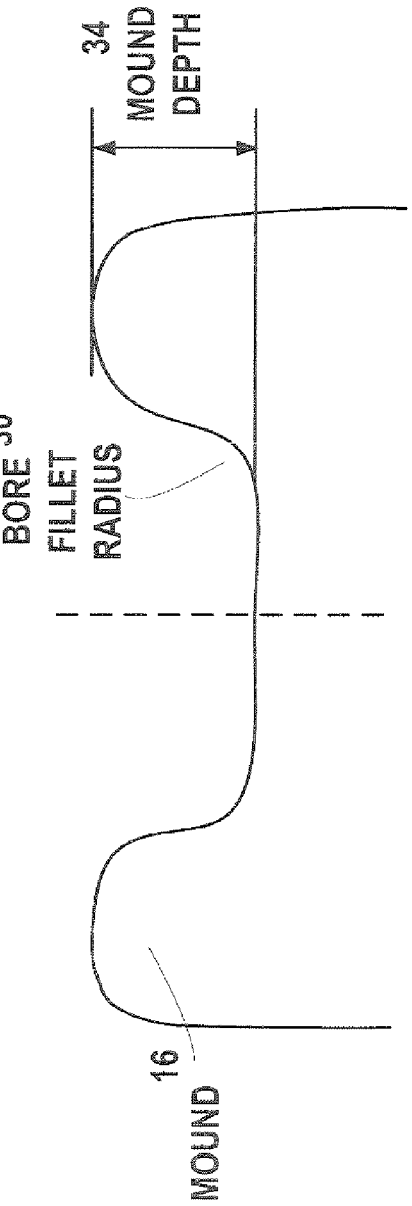
FIG. 1B is a pictorial drawing of a result of the bell bore implementation.

Multiple designs of the wax guard system are described below, including the bell bore design, the open design, Philip design, and the flip design. With the bell bore design, the wax guard is constructed by software; with the flip wax guard design, the wax guard is drilled inside the shell, and with the open wax guard and the Philip wax guard designs, the wax guard is glued on the canal tip. The following provides a more detailed discussion.

Bell Bore Wax Guard Design

FIGS. 1A through 2C illustrate the primary parameters that are utilized in the bell bore wax guard system generation. As noted previously, the bell bore is one of the types of wax guards available, and is illustrated in FIG. 1B. Other types of wax guards are possible, such as one with a completely flat shell tip, like the one shown in FIG. 1B, but with the mound depth equal to 0. In this case, a real wax guard protection system is drilled inside the shell after the manufacturing of the shell. Another type of wax guard is an open wax guard as illustrated in FIG. 2C. In this case, a real wax guard protection system is glued on the top of open wax guard.

Referring back to FIG. 1A, a shell model/impression 10 is illustrated in having a canal tip 12. A cutting plane 14 is applied to the canal tip 12 (FIG. 2A) at a distance defined by a canal tip offset 28. The result of applying the cutting plane 14 can be seen in FIG. 2B.

A series of parameters in addition to the canal tip offset 28 may then be applied to the shell 10 after application of the cutting plane 14. These include parameters related to a mound 16, such as the mound radius 22, mound distance 24, and mound depth 34. Parameters associated with a related bore 18 are also applied to the shell 10. These include the bore depth 26 (which is the same as the mound depth 34), and bore fillet radius 30.

According to an embodiment of the system, two principal planes are computed along a z-axis of the shell impression 10, with the canal tip 12 serving as the reference point for these planes. The canal tip region is automatically identified by the software system. The initial bore depth plane 20 is placed on a centerline along the z-axis at a configurable offset distance from the canal tip 12, called the flip distance 15. The centerline is generated along vertical scans of the impression 10.

The second cutting plane 14 is placed along the z-axis centerline at a configurable offset distance from the canal tip 12, called the canal tip offset 28. A bore depth 26 can then be determined as the difference between the flip distance 15 and the canal tip offset 28. The mound distance 24 can then be determined based on a configurable percentage (PercentMD) of a major axis of the generally elliptical shape formed by the intersection of the flip distance plane 20 and the outer surface of the canal portion.

A mound radius 22 can be defined as a configurable percentage (PercentMR) of the mound distance 24, and a mound bore fillet radius 30 can be defined as a configurable percentage (PercentFIR) of the mound distance 24. Any of the configurable parameters described herein can be accessible on a display of a user interface device according to known user interface objects, e.g., a preferences tab on a dialog box of the display. A user can adjust the planes 14, 20 if required by rotating and translating the planes. However, for translation, a constraint is made so that any translation is constrained to the z-axis, whereas rotation is allowed along the x- and y-axis. This is because planes 20 and 14 are parallel and the X and Y axes are located on the planes with the Z-axis being perpendicular to both planes. Thus, if user were to try to rotate the planes around the Z-axis, the picture will not change at all, because the planes have infinite dimensions in the XY plane. If the user tries to translate the planes in the X or Y axis, the picture will not change here either, because the Z axis still remains perpendicular to the plane, and, as plane is infinite, there is no change in the plane positions. When displaying an image of the impression 10 on the user interface device, the bore area can be presented in a transparent manner when it is selected.

Open Wax Guard Design

The open wax guard system can be presented to the user as an option for operating the system. The open wax guard system can be generated based on the general protocols defined for a bell bore design above by simply setting all parameters except the flip distance 15 to zero. The software then inserts and creates an open wax guard based on the flip distance 15 as defined previously. The default thickness of the open wax guard can be same as the shell wall thickness (see the illustration in FIGS. 2A-C).

Philip Wax Guard Design

The Philip wax guard can be implemented similar to the open wax guard design cut, however, a faceplate gluing option "extra gluing area" can be specified for the Philip wax guard in the wax guard option preferences for the user interface. If this option is chosen, the open wax guard is built as shown in FIG. 2C. Then the open wax guard is modified in a way similar to the way the normal shell is modified but on the tip side and not on the faceplate side, as illustrated in FIG. 3.

Figure 3:
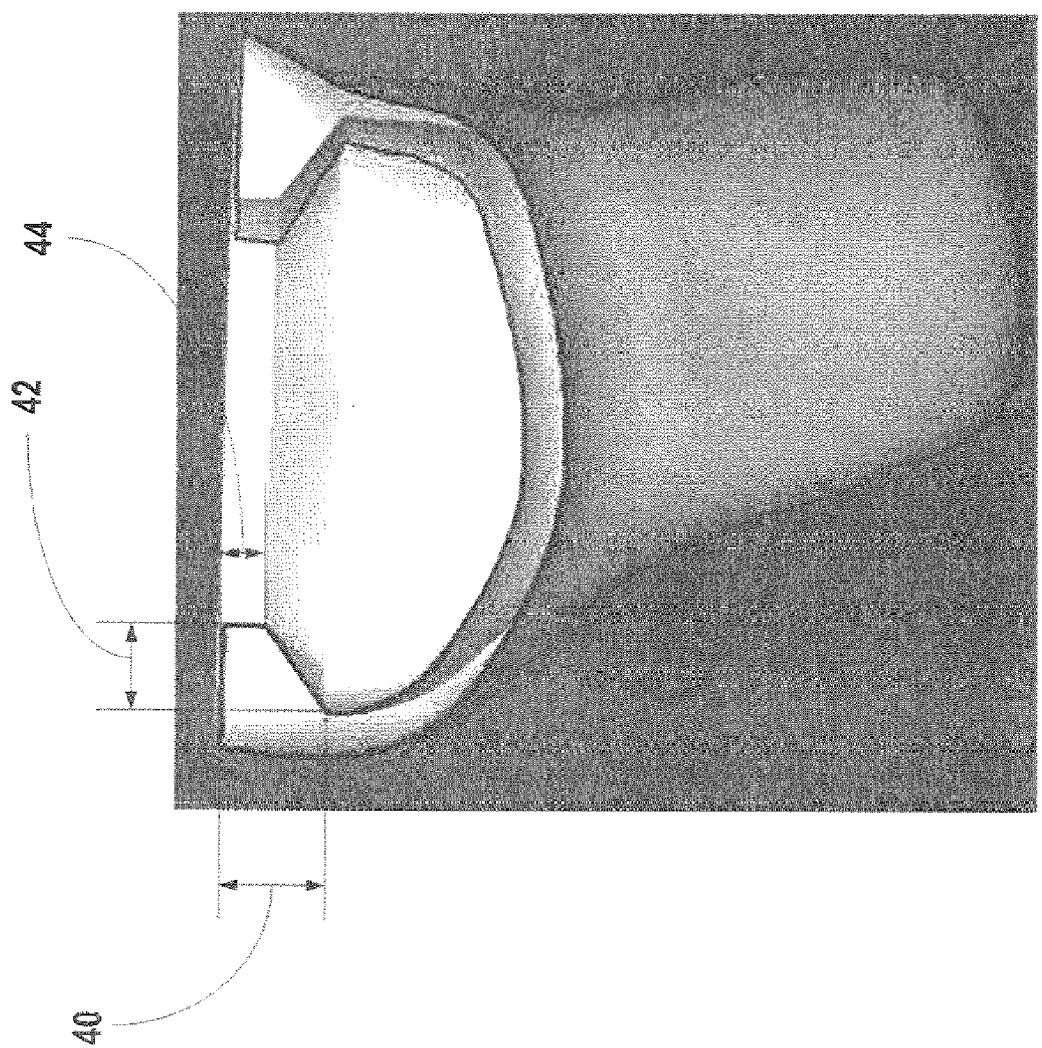
FIG. 3 is an image file illustrating a use of the gluing area option.

FIG. 3 illustrates the transition height 40, the gluing surface width 42, and the gluing surface thickness 44. The structure "gluing area" is built on the faceplate side of the shell. In the case of the Philip wax guard the structure is the same, but on the canal side, where open wax guard was applied. It is not necessary to build the gluing area on the faceplate side of the shell for Philip wax guard.

Under this design option, the receiver hole functionality is disabled for the Philip wax guard option; the receiver hole is a functionality used to drill the hole on the tip of the shell. In the case of the Philip wax guard, the tip is open (like in the open wax guard design), and therefore, there is no place to drill the receiver hole.

Flip Wax Guard Design

The flip wax guard can be implemented similar to bell bore with all parameters except the canal tip offset 28 set to zero.

Automatic Wax Guard Positioning

Similar to the implementation of the bell bore design, feature recognition algorithms are run on the given shell 10 to identify the canal 11, tip of the shell 12 and the central line 13—this software automatically recognizes the canal 11 and the tip of the canal 12, as well as the central line 13 of each impression 10. The feature recognition algorithms take the undetailed shell as an input and identify different shell features on the shell, such as the tragus, anti-tragus, concha, helix, etc. One of the features that is identified by the feature recognition algorithms is the canal tip 12; another feature is the central line 13. The tip 12 of the shell is the deepest point on the impression when it is inside the human ear, and the central line 13 is a 3D line inside the shell defined by being equally remote from shell surface on every cross-section.

The software ensures that the canal tip 12 and the central line 13 are detected correctly. Incorrect detection of these features may result in a mis-functioning of the automatic wax guard placement. If feature recognition algorithms fail to detect either the central line 13 or the canal tip 12 or both, an error message should be reported to the user via the user interface, log file, or the like, and the automatic wax guard positioning should be paused or terminated. Further status information about the detection process can be provided to the user to assist in determining the cause of failure.

The positioning algorithms described herein can interface to a separate feature recognition module via a defined set of interfaces or interface routines. In an optimum system, processing capability is provided to implement the automatic wax guard placement in less than approximately one second in order to facilitate real-time use.

Once the respective features have been determined, a back-end database of the system is read to determine which type of wax guard protection system is requested—these can be in the form of manufacturing option codes. The appropriate algorithms described above can then be implemented. The flip distance 15 is measured from the tip of the canal 12 along the central line 13 towards the aperture.

The wax guard plane 20 is positioned perpendicularly to the central line 13 at the flip distance 15 from the tip of the canal 12. The canal tip offset distance 28 is measured from the tip of the canal 12 along the central line 13 towards the aperture. The second wax guard plane 14 is positioned perpendicularly to the central line 13 at the canal tip offset distance 28 from the tip of the canal 12. After the planes 14, 20 are determined, the position and size of bell bore mounds may then be calculated, based on the configurable parameters discussed above, and the bell bore can be built. For the bell bore construction, the membrane is positioned on the plane 14 and glued onto the mound 16. The whole structure of the bell bore with membrane the wax guard on the finished product.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like. The word mechanism is used broadly and is not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

TABLE OF REFERENCE CHARACTERS 10 shell model
11 canal
12 canal tip
13 central line
14 cutting plane
15 flip distance
16 mound
18 bore
20 bore depth plane, flip distance plane, or wax guard plane
22 mound radius
24 mound distance
26 bore depth
28 canal tip offset
30 bore fillet radius
34 mound depth
40 transition height of gluing area
42 gluing surface width
44 gluing surface thickness

What is claimed is:

1. A method for automatically adding a wax guard to a hearing aid shell impression, comprising:
   providing a digital 3D representation of a hearing aid shell impression;
   automatically identifying location information for a canal, tip of the canal, and central line of the impression;
   determining a first wax guard plane at a predefined flip distance from the canal tip along the central line;
   determining a second wax guard plane at a predefined canal tip offset distance from the canal tip along the central line;
   calculating a size and position for a feature of the wax guard based on predefined parameters; and
   constructing the wax guard utilizing the calculated size and position.

2. The method according to claim 1, further comprising selecting a wax guard type from the group consisting of a bell bore design, an open design, a Philip design, and a flip design.

3. The method according to claim 2, wherein the type is the bell bore design and the wax guard feature is a mound, the method further comprising;
   positioning a membrane on the second wax guard plane; and
   gluing the membrane onto the mound.

4. The method according to claim 3, wherein calculating the size and position of the bell bore comprises utilizing a mound radius and mound distance.

5. The method according to claim 4, further comprising defining the mound radius as a configurable percentage of the mound distance.

6. The method according to claim 4, further comprising calculating a mound bore fillet radius.

7. The method according to claim 6, further comprising defining the mound bore fillet radius as a configurable percentage of the mound distance.

8. The method according to claim 2, wherein the type is the open design, further comprising defining the flip distance to be zero.

9. The method according to claim 8, wherein a default thickness of the open wax guard is the same as a shell wall thickness.

10. The method according to claim 2, wherein the type is the Philip design, the method further comprising:
    specifying an extra gluing area based on predefined gluing area parameters; and
    building the gluing area on a canal side of the shell.

11. The method according to claim 10, further comprising disabling a receiver hole functionality.

12. The method according to claim 10, wherein the predefined gluing area parameters comprise a transition height, a gluing surface width, and a gluing surface thickness.

13. The method according to claim 2, wherein the type is the flip design, wherein parameters bore depth, mound radius, bore fillet radius, mound distance, and mound depth are set to zero, and wherein the flip distance is equal to the canal tip offset.

14. The method according to claim 1, further comprising:
    adjusting, by a user, the first wax guard plane and the second wax guard plane on a user display device.

15. The method according to claim 1, wherein a wax guard type is a bell bore design, the method further comprising:
    representing an area of the bell bore on a user display device in a transparent manner.

16. A computer-based system for automatically adding a wax guard to a hearing aid shell impression, comprising:
   a processor;
   a user display device connected to the processor;
   a data storage device connected to the processor and the user display device, the storage device containing a 3D representation of a hearing aid shell impression;
   a software module for automatically identifying location information for a canal, tip of the canal, and central line of the impression from the 3D representation of the hearing aid shell impression;
   a software module for determining a first wax guard plane at a predefined flip distance from the canal tip along the central line;
   a software module for determining a second wax guard plane at a predefined canal tip offset distance from the canal tip along the central line;
   a software module for calculating a size and position for a feature of the wax guard based on predefined parameters; and
   a software module for producing a finished model of the shell including the wax guard utilizing the calculated size and position.

17. A computer-based system for automatically adding a wax guard to a hearing aid shell impression, comprising:
   a means for automatically identifying location information for a canal, tip of the canal, and central line of the impression from a 3D representation of the hearing aid shell impression;
   a means for determining a first wax guard plane at a predefined flip distance from the canal tip along the central line;
   a means for determining a second wax guard plane at a predefined canal tip offset distance from the canal tip along the central line;
   a means for calculating a size and position for a feature of the wax guard based on predefined parameters; and
   a means for producing a finished model of the shell including the wax guard utilizing the calculated size and position.

* * * * *